(12) United States Patent
Schmidt et al.

(10) Patent No.: US 6,600,103 B1
(45) Date of Patent: Jul. 29, 2003

(54) HOUSING FOR AN ELECTRONIC DEVICE IN MICROWAVE TECHNOLOGY

(75) Inventors: Ewald Schmidt, Ludwigsburg (DE); Klaus Voigtlaender, Wangen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/890,368

(22) PCT Filed: Jan. 4, 2000

(86) PCT No.: PCT/DE00/00022
§ 371 (c)(1),
(2), (4) Date: Sep. 17, 2001

(87) PCT Pub. No.: WO00/45462
PCT Pub. Date: Aug. 3, 2000

(30) Foreign Application Priority Data

Jan. 28, 1999 (DE) .......................................... 199 04 303

(51) Int. Cl.[7] ................................................. H01Q 1/42
(52) U.S. Cl. ............................. 174/52.1; 343/700 MS; 343/872
(58) Field of Search ............................. 174/52.1, 35 R; 343/700 R, 701, 700 MS, 872, 873, 789; 361/679, 748, 760

(56) References Cited

U.S. PATENT DOCUMENTS 4,914,448 A * 4/1990 Otsuka et al. .............. 343/872
5,512,901 A * 4/1996 Chen et al. ................. 342/175
5,625,365 A * 4/1997 Tom et al. ............ 343/700 MS
5,828,339 A 10/1998 Patel

FOREIGN PATENT DOCUMENTS

| DE | 44 12 770 A | 10/1995 |
|---|---|---|
| DE | 44 47 513 A1 | 2/1996 |
| DE | 44 45 125 A1 | 6/1996 |
| DE | 195 30 065 A | 1/1997 |
| DE | 196 42 810 C | 4/1998 |
| EP | 0 642 190 A | 3/1995 |
| EP | 0 685 930 A1 | 12/1995 |
| FR | 2 710 195 A | 3/1995 |

* cited by examiner

Primary Examiner—Dean A. Reichard
Assistant Examiner—Carmelo Oliva
(74) Attorney, Agent, or Firm—Michael J. Striker

(57) ABSTRACT

The invention relates to a housing for an electronic device in microwave technology, which is comprised of three tightly connected parts (2, 8, 11). A middle part (2) is comprised of a metal plate to which at least one circuit board (6, 7) can be attached and recesses are provided which, together with the at least one circuit board (6, 7), can produce chambers (4, 5) into which the components of the one electronic circuit protrude. Furthermore, a plastic bottom part (8) with a connector device (9) and a plastic top part (11) are provided which likewise produce chambers (12, 13) for electronic and/or microwave components.

14 Claims, 3 Drawing Sheets

HOUSING FOR AN ELECTRONIC DEVICE IN MICROWAVE TECHNOLOGY

BACKGROUND OF THE INVENTION

The invention relates to a housing for an electronic device in microwave technology, in particular for a radar sensor.

It is known from EP 0 685 930 A1, for example, that a radar sensor with a mount can be screwed to the exterior of a vehicle, for example in order to measure the distance to a vehicle ahead of it. This radar sensor has an oscillator, a mixer, an amplifier, and an antenna system for producing and receiving radar radiation as well as a receiver with evaluation electronics. In these known apparatuses, the components mentioned above are installed in one or more housings which are individually closed, as a rule very tightly, and then are fastened to the vehicle with suitable mounts.

For the technical circuit design of the evaluation electronics, it is intrinsically known to use multilayer printed boards which are mounted in the housing, possibly with an additionally placed evaluation board. In the mount, this apparatus is then installed in the bumper of the motor vehicle, for example. The essential size of the device in this connection is contingent upon the separate antennas for sending and receiving, which emit radiation through the bumper in the direction of interest. For space-saving reasons, the components are as a rule accommodated on the top between the antennas, but this can generate an undesirable leakage radiation. This requires the use of expensive shields, for example with foam absorbers, and results in high manufacturing costs due to the large number of parts.

SUMMARY OF THE INVENTION

In the improvement according to the invention, a housing of the type mentioned at the beginning, which is for use In microwave technology, has the advantage that the housing is comprised of three parts tightly connected to one another, which can be made of the most favorable material and in terms of design, can be each be embodied optimally in detail to the components to be disposed in them.

Particularly for sensing distances and speeds by means of microwave radar around a motor vehicle, the invention permits the production of a compact radar sensor in which the integration of antenna structures can be advantageously designed to reduce overall dimensions. The radar sensors required for this operate in a frequency band of approximately 24 GHz, offer the advantage of small antennas, and are relatively inexpensive to produce.

The housing according to the invention is advantageously comprised of a metal plate in its middle part, to which at least one circuit board can be attached. There are also recesses which, together with the at least one circuit board, form chambers into which the components of the electronic circuit can protrude. The bottom part, which is injection molded of plastic, has a connector device that can be contacted from the outside. The upper part is the plastic cover which is also injection molded and can also, together with the at least one circuit board, form chambers for electronic and/or microwave components. The encapsulation of the components according to the invention advantageously suppresses undesirable emissions of microwave radiation.

Advantageously, the middle part is provided with centering marks which engage in corresponding marks on the bottom part and on the cover during assembly and to simplify production, the middle part can also be symmetrically designed.

In order to attach circuit boards to the middle part, it can also be advantageously provided with recesses and mounting points; depending on the components required, one or two circuit boards can be provided, for example an upper and a lower one. The circuit details with the antenna structures must be placed on the upper circuit board due to the emission of microwaves. Multilayer circuit boards equipped on one or both sides, which are made of composite materials or multilayered ceramics, can be used in this connection, whose connections must be contacted, e.g. bonded, before the lower connector part is mounted onto the bottom. In another work step, the upper circuit board can be bonded; in this instance, a favorable disposition of contacts arranged in a row does not require any large travel distances.

The lower connector part of the housing according to the invention has the required number of connector contacts and a connector form adapted to the respective intended use; the connector contacts are injection molded in place and can be glued to the metal plate when being assembled with the middle part. As a result, the bottom part of the housing, which is comprised of the middle part and the lower connector part, can be closed in a watertight fashion where additional clips can produce an adjustment and can prevent a shifting before the gluing.

The cover of the housing according to the invention is designed in a particularly advantageous manner for encapsulating the individual units, such as antennas, oscillator, mixer, evaluation electronics, etc.. In the regions disposed opposite the antennas, materials are provided as so-called optical windows to improve the transmission of microwaves and in the other regions, materials are provided to absorb microwaves. Consequently, several functions are integrated into the plastic cover of the housing in a simple manner.

A first advantageous embodiment for producing these optical windows can be achieved by clipping metal structures into the corresponding chambers on the cover. In addition, a flat ceramic plate can also be affixed between the wall of the cover and the metal structures that are clipped in place.

In another advantageous embodiment, the optical windows are produced by metal grating structures that are injection molded in place. Furthermore, the optical windows can be fundamentally comprised of a ceramic plate that is metallized on one or both sides and is injection molded in place, where the outer side or both the outer and inner sides of the ceramic plate is/are injection molded into the cover. The metallizations on the ceramic plate can be connected to the ground of the circuit board by means of a metal spring.

For a suitable dimensioning of the chambers and parts of the housing according to the invention, for example at a frequency of 24 GHz, the distances and the material thicknesses are selected in multiples of a fourth of the wavelength of the microwave radiation. For example in air, the distance between the ceramic plate and the circuit board is approximately 3 mm, the thickness of a thick-layered ceramic plate is 1 mm, and the plastic is approx. 1.7 mm. The plastic coating, which can be applied to one or both sides, is also used here as an adaptation structure because of its dielectric constants. In order to use so-called superstrate effects, the distance in air must thereby be selected to be on the magnitude of $\lambda/2$ of the microwave length, while the ceramic plate must be $\lambda/4$ thick. Through the selection of a suitable metallization of the ceramic plate, the desired antenna characteristics can be achieved with only one patch as a power element in order to limit the size.

In an advantageous embodiment, the antennas are comprised of a number of patches, for example 2, 3, 4, or 6 of them; inwardly protruding dielectric horns can be provided as focusing devices in the optical windows above these patches. It is also advantageously possible for inwardly and/or outwardly protruding dielectric lenses to be provided as focusing devices in the optical windows.

Through the use of the above-mentioned focusing elements, circuit boards can be advantageously used which are significantly smaller than is possible in an apparatus with only one patch. The only requirement here is that the plastic of the cover be microwave permeable, as is the case, for example, with polyetherimide or comparable plastics.

After complete assembly of the individual parts of the housing, the cover is consequently also glued to the combination of the lower connector part and the metal middle part and is therefore also closed in a watertight fashion. In order to fasten the housing, for example to the bumper of a motor vehicle, a mount is provided on at least one of the three parts and is comprised of an extension, possibly with a thickening, with elements that can be screw connected or clipped in place. An extension and thickening of the middle part offers the advantage of better heat dissipation; by contrast, it is less expensive in terms of manufacturing to affix the mount to the plastic bottom part.

The pressure compensation inside the housing can be executed with conventional, known pressure compensation elements; a pressure compensation is also possible inside the connector and via the copper cores of the companion part plugged into it. The proposed housing according to the invention is suitable not only for building a radar sensor but also for building communications devices and other sensors which use microwaves in a frequency range of up to 140 GHz. The geometries of the housing simply need to be adapted to the components required and the wavelengths used.

In addition to the claims, these and other characteristics of proposed improvements of the invention can also be inferred from the specification and the drawings; the individual characteristics can be respectively produced in and of themselves or combined in the form of sub-combinations in the embodiment of the invention, can be produced in other areas, and can represent intrinsically patentable embodiments which are claimed herein.

BRIEF DESCRIPTION OF THE DRAWINGS

Exemplary embodiments of a housing according to the invention for an electronic device in microwave technology are explained in conjunction with the drawings.

DESCRIPTION OF THE PREFERRED EMBODIMENTS

Figure 1:
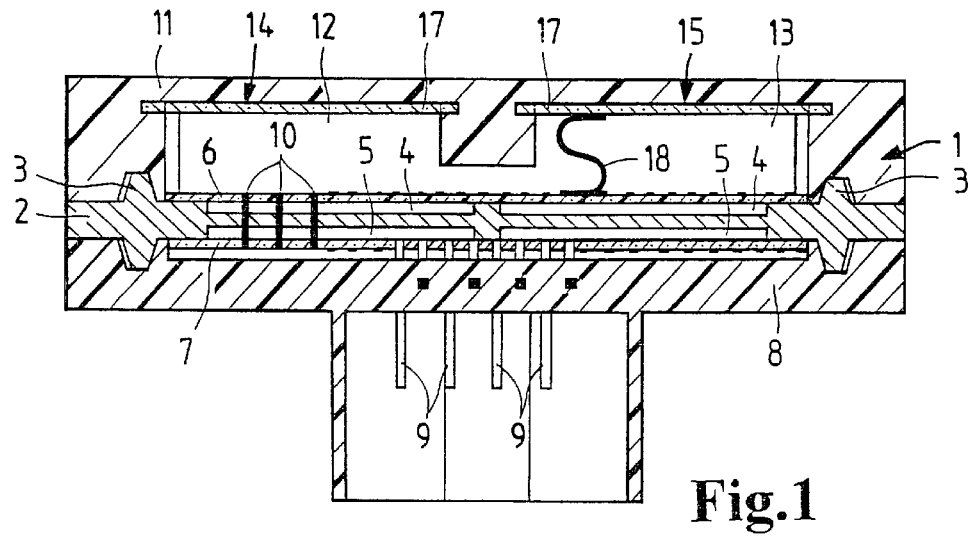
FIG. 1 is a section along a longitudinal line through the principal structure of a housing of this kind.

FIG. 1 shows a housing 1 for a radar sensor as a microwave device, which can be fastened to a motor vehicle, for example to the bumper, in such a way that it can emit electromagnetic waves for distance sensing. The housing 1 has a middle part 2 which is comprised of a metal plate and is provided with centering marks 3 for adjusting the other housing parts and is provided with recesses or chambers 4 on the one side and with recesses or chambers 5 on the other side. The chambers 4 and 5 can, for example, be symmetrically disposed; circuit boards 6 and 7 are disposed in the chambers 4 and 5 and are connected to the middle part 2 by means of mounts that are not shown here.

In a modification of the embodiment shown in FIG. 1, the housing can also be embodied with only one circuit board, e.g. the circuit board 6. Components of the electronic circuit, in particular also microwave emitting components, can be accommodated in the chambers 4 and 5. The circuit details with the antenna structures must in any case rest on the upper circuit board 6 due to the omission of microwaves. Multilayer circuit boards equipped on one or both sides can be used as circuit boards here, which are comprised of composite materials or multilayered ceramics.

There is also a bottom part 8, preferably an injection molded plastic part, which has a connector device 9. This part 8 has recesses in which the markings 3 of the middle part 2 can engage and the position of the parts 2 and 8 is consequently fixed and in addition, a tight reciprocal fit is possible. The connections on the circuit boards 6 and 7 must be contacted, e.g. bonded, possibly also with through contacts 10, before installation of the lower connector part 8 onto the bottom. The connector contacts of the connector device 9 can be injection molded here and can be glued to the middle part 2, i.e. to the metal plate.

In addition, in the exemplary embodiment according to FIG. 1, an upper part 11, preferably also an injection molded plastic part, is provided as a cover, which likewise has recesses in which the markings 3 of the middle part 2 can engage and consequently the position of the parts 2 and 11 is fixed and sealed in the same way as the assembly of the parts 2 and 8. Chambers 12 and 13 are also embodied in the upper part 11 and individual units such as antennas, oscillators, mixers, and evaluation electronics can protrude into these chambers.

In the regions 14 and 15 disposed opposite the antennas, there are so-called optical windows in the plastic part 11 according to FIG. 1, which contribute to an encouragement of the transmission of microwaves. In the other regions of the part 11, the materials are disposed so that they are suited for the adsorption of microwaves. The optical windows can, for example, be comprised of a flat ceramic plate 11 that is injection molded in place and is metallized on one or both sides; the outer side or both the outer and inner sides of the respective ceramic plate 17 is/are injection molded into the region 14 or 15 of the upper part 11. The metallizations on the ceramic plate 17, which are not shown here, can be connected to the ground of the circuit board 6 by means of a metal spring 18.

Figure 2:
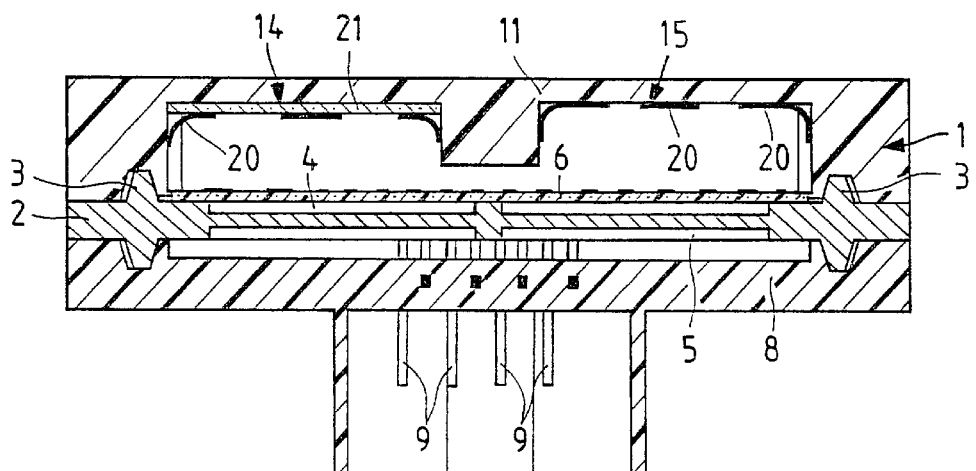
FIG. 2 is a section through an exemplary embodiment which, in contrast to FIG. 1, is provided with metal clips in the optical window of the antenna system in the housing.
Figure 3:
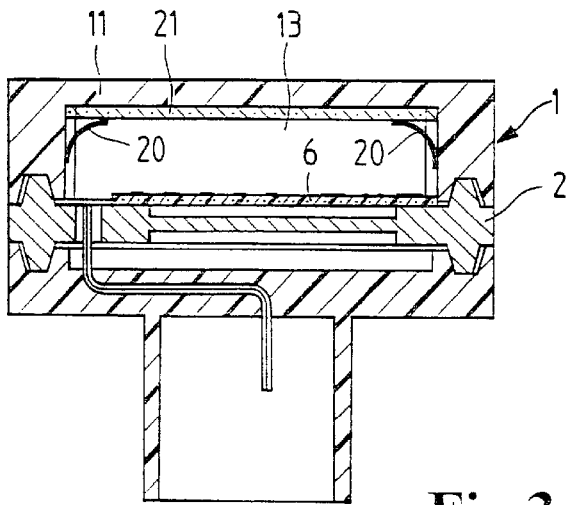
FIG. 3 is a section along a lateral line of the exemplary embodiment according to FIG. 2.

FIG. 2 shows another exemplary embodiment for producing the above-mentioned optical windows in the regions 14 and 15 of the upper part 11; components which have not been changed are provided with the same reference numerals here as in FIG. 1. The optical windows can be produced here by clipping metal structures 20 under a flat ceramic plate 21 in the region 14 on the left and by clippling the metal structures 20 directly to the plastic of the upper part 11 in the region 15 on the right. FIG. 3 also shows the position of the metal structures 20 in a section along a transverse line through the housing 1.

Figure 4:
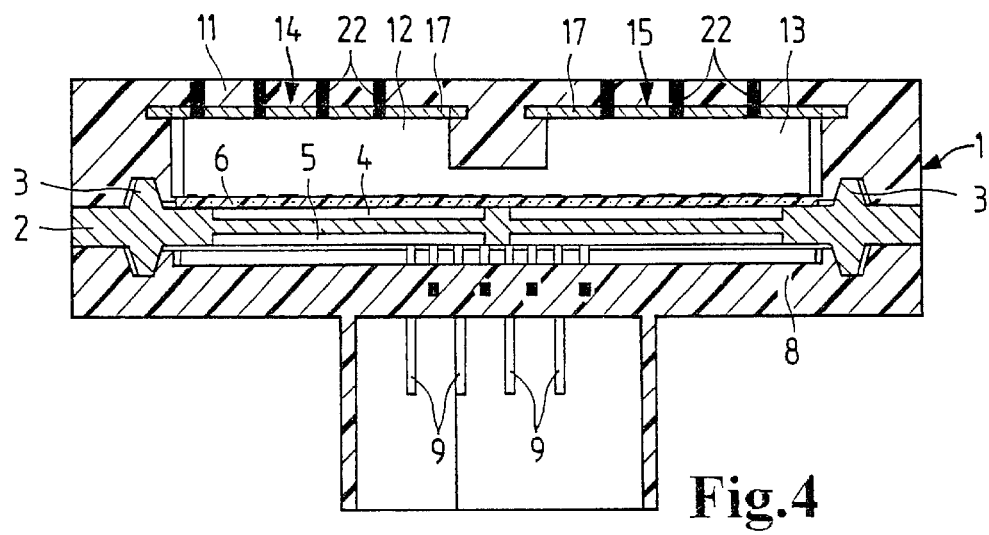
FIG. 4 is a section through an exemplary embodiment which, in contrast to FIG. 1, is provided with a metal structure injection molded into the optical window of the antenna system in the housing.

In an exemplary embodiment according to FIG. 4, the optical windows are produced by means of metal grating structures 22, which have a focusing action, being injection molded into the plastic in the regions 14 and 15 of the upper part 11.

Figure 5:
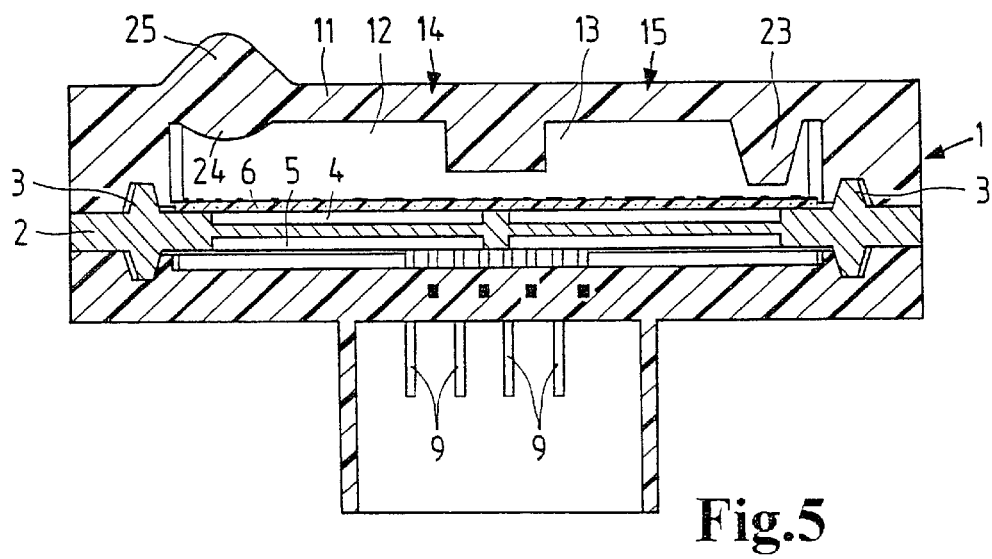
FIG. 5 is a section through an exemplary embodiment which, in contrast to FIG. 1, is provided with focusing devices in the optical window of the antenna system in the housing.
Figure 6:
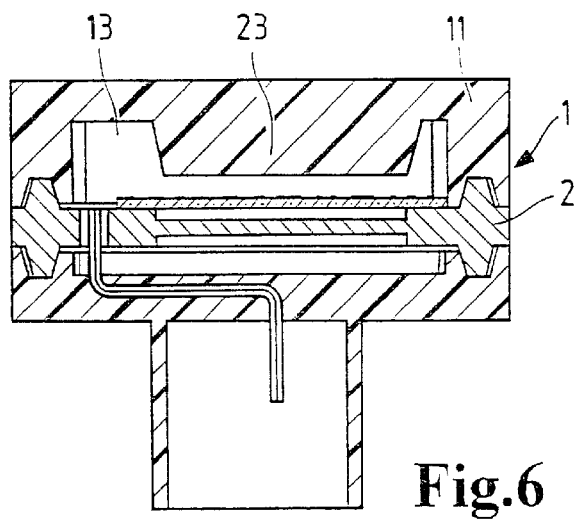
FIG. 6 is a section along a lateral line of the exemplary embodiment according to FIG. 5.

If an antenna system is designed, in a manner not shown in detail here in the Figs., in such a way that the antennas are comprised of a number of patches, for example three of them, then according to the exemplary embodiment in FIGS. 5 and 6, focusing devices can be affixed above these patches in the optical windows of the regions 14 and/or 15. In the region 15 on the right, so-called dielectric horns 23 provided as focusing devices protrude into the chamber 13 of the housing 1. In the region 14 on the left in FIG. 5, inwardly and/or outwardly protruding dielectric lenses 24 and/or 25 are provided as focusing devices in the optical windows. The dielectric horn 23 from FIG. 5 is also shown in FIG. 6, in a sectional view along a transverse line.

Figure 7:
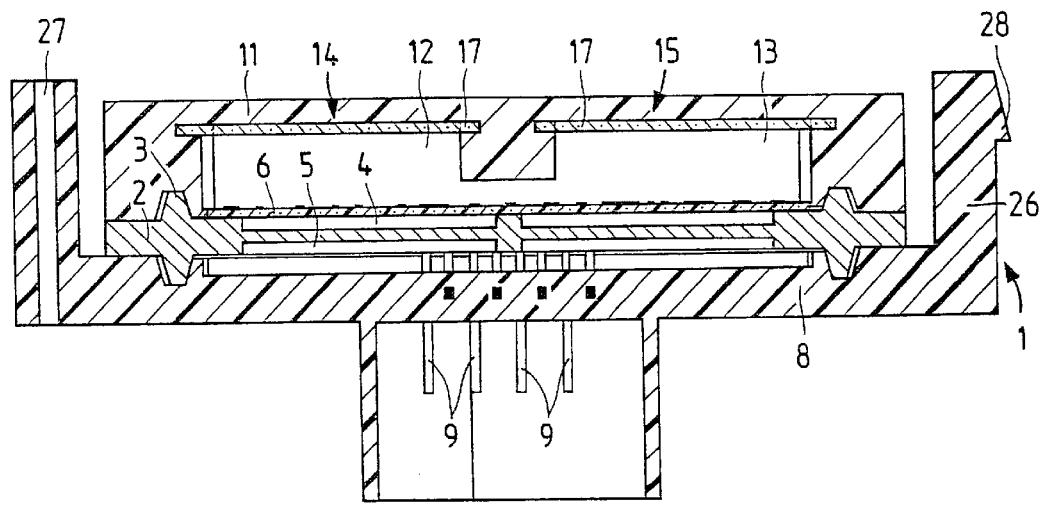
FIG. 7 is a section through an exemplary embodiment which, in a supplement to FIG. 1, is provided with a mount on the bottom part of the housing
Figure 8:
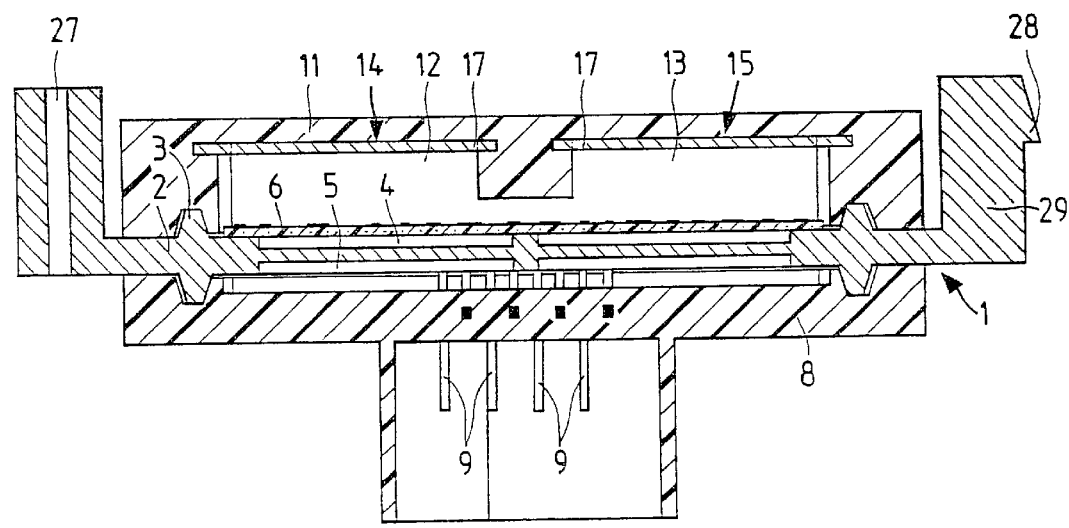
FIG. 8 is a section through an exemplary embodiment which, in a supplement to FIG. 1, is provided with a mount on the middle part of the housing.

FIGS. 7 and 8 show exemplary embodiments of a suitable mount for fastening the housing 1, for example to the bumper of a motor vehicle. According to FIG. 7, a mount 26 in the form of an extension of the plastic bottom part 8 of the housing 1 is proposed which, possibly with a thickening, can be screw connected by means of a bore 27 or clipped by means of a clip element 28. A mount 29 using an extension and thickening of the metal middle part 2 is shown in FIG. 8; where in this instance the screw- or clip elements 27 and/or 28 of the kind in FIG. 7 can be used.

What is claimed is:

1. A housing for an electronic device in microwave technology, comprising housing parts tightly connectable with one another and; an electronic circuit located in the housing; microwave components located in the housing and including antennas for sending and receiving microwaves, said housing parts including a bottom part, a middle part, and a top part, said middle part being formed as a metal plate to which at least one circuit board is attachable and which has recesses which, together with the at least one circuit board, form chambers into which components of the electronic circuit protrude, said bottom part having an externally connectable connector device, said top part being affixed as a cover, which together with the at least one circuit board, can also form chambers for electronic or microwave components, said middle part being provided with centering marks which engage in corresponding marks of said bottom part and said top part during assembly.

2. An electronic circuit and microwave components as defined in claim 1, wherein said middle part is symmetrical.

3. An electronic circuit and microwave components as defined in claim 1, wherein said top part is formed so that in regions disposed opposite to the antennas, materials are provided that serve as optical windows for encouraging a transmission of microwaves, and in other regions materials are provided to absorb microwaves.

4. An electronic circuit and microwave components as defined in claim 3, wherein said optical windows are formed as a ceramic plate which Is Injection molded in place and is metalized on at least one of its sides, said ceramic plate having an outer side and an inner side, such that at least one of said sides is injection molded In place.

5. An electronic circuit and microwave components as defined in claim 4, wherein said ceramic plate has metallizations connected to a ground of the circuit board by a metal spring.

6. An electronic circuit and microwave components as defined in claim 3, wherein said optical windows are formed by clipping metal structures in place.

7. An electronic circuit and microwave components as defined in claim 6, wherein a flex ceramic plate is affixed between a wall of said top part and the metal structures that are clipped in place.

8. An electronic circuit and microwave components as defined in claim 3; and further comprising metal grating structures that are injection molded in place and provide a focusing action in said optical windows.

9. An electronic circuit and microwave components as defined in claim wherein said antennas are composed of a number of patches, and Inwardly protruding dielectric horns are provided above said edges in said chambers of said top part as focusing apparatuses.

10. An electronic circuit and microwave components as defined in claim 9, wherein said antennas are composed of a number of patches; and further comprising dielectric lens which protrude inwardly or outwardly above said patches and are formed as focusing apparatuses.

11. An electronic circuit and microwave components as defined in claim 1, wherein at least one of said housing parts has a mount composed of an extension.

12. An electronic circuit and microwave components as defined in claim 11, wherein said mount has a thickening with elements which can be screwed or clipped in place.

13. An electronic circuit and microwave components as defined in claim 11, wherein said mount Is composed of plastic.

14. An electronic circuit and microwave components as defined in claim 11, wherein said mount is composed of metal.

* * * * *